United States Patent
Chih et al.

(10) Patent No.: US 6,842,381 B2
(45) Date of Patent: Jan. 11, 2005

(54) METHOD OF MARGINAL ERASURE FOR THE TESTING OF FLASH MEMORIES

(75) Inventors: Yue-Der Chih, Hsin-Chu (TW);
Ching-Huang Wang, Ping-Shen (TW);
Cheng-Hsiung Kuo, Tainan (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 0 days.

(21) Appl. No.: 10/725,809

(22) Filed: Dec. 2, 2003

(65) Prior Publication Data

US 2004/0109379 A1 Jun. 10, 2004

Related U.S. Application Data

(63) Continuation-in-part of application No. 10/056,978, filed on Jan. 25, 2002, now abandoned.

(51) Int. Cl.[7] .............................................. G11C 16/04
(52) U.S. Cl. .............................. 365/185.29; 365/185.33
(58) Field of Search ..................... 365/185.18, 185.21, 365/185.22, 185.29, 185.33

(56) References Cited

U.S. PATENT DOCUMENTS

| | | | |
|---|---|---|---|
| 4,809,231 A | 2/1989 | Shannon et al. | 365/201 |
| 4,875,188 A * | 10/1989 | Jungroth | 365/185.33 |
| 4,903,265 A | 2/1990 | Shannon et al. | 371/21.4 |
| 5,142,495 A | 8/1992 | Canepa | 365/189.09 |
| 5,297,101 A * | 3/1994 | Tada et al. | 365/185.21 |
| 5,369,616 A | 11/1994 | Wells et al. | 365/218 |
| 5,455,794 A * | 10/1995 | Javanifard et al. | 365/185.18 |
| 5,544,116 A | 8/1996 | Chao et al. | 365/210 |
| 5,675,537 A | 10/1997 | Bill et al. | 365/185.22 |
| 5,784,315 A * | 7/1998 | Itoh | 365/185.22 |
| 5,870,407 A | 2/1999 | Hsia et al. | 371/21.1 |
| 6,002,355 A * | 12/1999 | Del Signore et al. | 327/534 |
| 6,011,723 A * | 1/2000 | Atsumi et al. | 365/185.18 |
| 6,122,198 A | 9/2000 | Haddad et al. | 365/185.22 |
| 6,236,597 B1 * | 5/2001 | Sansbury | 365/185.22 |
| 6,249,455 B1 * | 6/2001 | Kim | 365/185.33 |
| 6,370,061 B1 * | 4/2002 | Yachareni et al. | 365/185.22 |

* cited by examiner

Primary Examiner—Trong Phan
(74) Attorney, Agent, or Firm—Duane Morris LLP

(57) ABSTRACT

Voltage-dropping components are bypassed during testing of the erasing of a flash memory device thereby effectively lowering the applied erase voltage to the marginal level desired ($V_{ME}$). These voltage-dropping components may be a plurality of diode-connected NMOS transistors. If a plurality of diode-connected NMOS transistors are used, the voltage applied to the flash macro is reduced by $m*V_t$, where m is the number of bypassed diode connected NMOS transistors and $V_t$ is the threshold voltage of the NMOS transistors. In normal operation, the voltage dropping components are placed in series with the charge pump, thereby returning the voltage applied to the flash macro to the normal level ($V_{NE}$).

26 Claims, 3 Drawing Sheets

METHOD OF MARGINAL ERASURE FOR THE TESTING OF FLASH MEMORIES

This application is a Continuation in Part of U.S. patent application Ser. No. 10/056,978, filed Jan. 25, 2002, now abandoned which is herein incorporated by reference.

BACKGROUND OF THE INVENTION (1) Field of the Invention

The invention generally relates to a method used in semiconductor memory manufacturing and, more particularly, to a method of erasing memory cells during testing in a flash electrically erasable programmable read only memory (EEPROM) in the fabrication of integrated circuits (ICs).

(2) Description of Prior Art

Electrically erasable EEPROMs, often referred to as "Flash" EPROM, have emerged as an important non-volatile memory. Having the same cell density as standard EPROMs, they have the advantage over EPROMs that they need not be exposed to ultraviolet (UV) light to be erased. This is also an advantage in that standard IC packages can be used for these devices whereas standard EPROMs require a special package allowing the IC die to be exposed to UV light.

In a standard Flash EPROM, a plurality of flash memory cells are arranged in an array of rows and columns. Refer now to FIG. 1 showing a typical flash memory cell device. Each cell 10 is composed of a p-type substrate 12 and separate n-type source 14 and drain 16 regions formed on the substrate 12. A p-type channel region 18 in the substrate 12 separates the source 14 and drain 16. A floating gate 20, electrically isolated from and positioned over the channel region 18, is separated from the substrate 12 by a thin dielectric layer 22. A control gate 24 is separated from the floating gate 20 by a second dielectric layer 26.

To program the flash EPROM cell, the drain and control gate are raised to voltages above the voltage applied to the source region. For example, the drain voltage ($V_D$) and control gate voltage ($V_{CG}$) are set to 5.5V and 9V above the source voltage, respectively. This produces hot electrons, which are transferred across the thin dielectric layer, trapping them on the floating gate. The control gate voltage threshold is the minimum voltage that must be applied to the control gate in order to affect conduction between the source and drain. This injection of hot electrons has the effect of raising the control gate threshold by about two to four volts.

To erase a flash EPROM cell, the source voltage ($V_S$) is set to a positive voltage and the control gate voltage ($V_{CG}$) is set to a negative voltage while the drain floats. Typically, the minimum normal source to control gate erase voltage ($V_{NE}$) is 11 volts. An electric field forms between the source and floating gate thereby removing the negative charge on the floating gate by Fowler-Nordheim tunneling. The minimum erase voltage increases with the number of program and erasure cycles performed. This is depicted in FIG. 2 where the minimum erase voltage is approximately 11.2V at the time of manufacturing and increases to just under 13V after 90,000 erasures, In order to predict the proper operation of the device over the device lifetime, a lower voltage such as 12V is typically used during chip probe testing. This lower voltage test is referred to as marginal erase. If the memory will erase at this lower voltage at wafer probe, then it is statistically predicted that it will continue to erase at $V_{NE}$ for many thousands of erasures.

FIG. 3 schematically shows how the normal and margin erase voltages are typically generated. During normal operation, an erase voltage $V_E$ is generated from a charge pump circuitry and regulated by a regulator in the flash macro 42. For marginal erase testing, a fixed external voltage ($V_{ME}$) is applied to a test pad (30) to perform the marginal erase. $V_{ME}$ is applied through resistor 32 by closing a switch 44 within the flash macro 42. Unfortunately, this requires placement of the additional test pad 30 to apply the marginal erase voltage ($V_{ME}$) during chip probe. In addition, since $V_{ME}$ is fixed, it cannot compensate for changes observed in the normal erase voltage ($V_{NE}$) due to process variations.

FIG. 4 illustrates the process variation in $V_{NE}$ and further demonstrates that using a fixed $V_{ME}$ will result in a variation in the differences between $V_{NE}$ and $V_{ME}$. This reduces the effectiveness of the margin erase test in guaranteeing the endurance specification.

Other approaches related to improving memory device circuits exist. U.S. Pat. Nos. 4,809,231 and 4,903,265 to Shannon et al. describe methods for post-package testing of one-time-programmable (OTP) EPROM memories where cells are marginally programmed to demonstrate that they are addressable. This is accomplished by applying special programming voltages such that the cell threshold changes slightly, but not enough to exceed the maximum erased specification. U.S. Pat. No. 5,142,495 to Canepa teaches a margining circuit in an EPROM where a plurality of parallel transistors form a variable load. This effectively adjusts the current applied to the memory cell. U.S. Pat. No. 5,369,616 to Wells et al. teaches a method where non-volatile memory is used to set memory system parameters such as threshold, word length, and addressing scheme. U.S. Pat. No. 5,544,116 to Chao et al. teaches a method of verifying program states of Flash EPROM cells where different voltages are applied to the reference and memory cells. This controls the ratio of the currents in those cells making cell verification more accurate. U.S. Pat. No. 5,675,537 to Bill et al. teaches a method where overerasure of memory cells in a Flash EPROM is prevented by halting erasure once a prescribed cell threshold is reached. U.S. Pat. No. 5,870,407 to Hsia et al. teaches a method of predicting high temperature failures of Flash EPROM memory devices that reduces testing time and packaging cost. U.S. Pat. No. 6,122,198 to Haddad et al. teaches a method for guaranteeing that an erased cell threshold voltage in a two bit per cell Flash EPROM falls within prescribed limits. This is accomplished by testing for both over and under erase conditions until all cells pass satisfactorily.

SUMMARY OF THE INVENTION

A principal object of the present invention is to provide a method that uses an internal marginal erase voltage in a Flash EPROM memory.

Another object of the present invention is to provide a method that uses an internal marginal erase voltage that is lower than the normal erase voltage in a Flash EPROM memory.

Another object of the present invention is to provide a method that uses an internal marginal erase voltage that is lower than the normal erase voltage by a fixed amount.

Another object of the present invention is to provide a method that uses an internal marginal erase voltage that is lower than the normal erase voltage by a fixed amount which tracks over processing variations and improves the endurance specification in a Flash EPROM memory.

Another object of the present invention is to provide a method that eliminates the need for a high voltage probe pad by using an internally generated marginal erase voltage in a Flash EPROM memory.

These objects are achieved by using a method where voltage-dropping components are bypassed during testing thereby effectively lowering the applied erase voltage to the marginal level desired ($V_{ME}$). These voltage-dropping components may be a plurality of diode-connected NMOS transistors. If a plurality of diode-connected NMOS transistors are used, the voltage applied to the flash macro is reduced by $m*V_t$, where m is the number of bypassed diode connected NMOS transistors and $V_t$ is the threshold voltage of the NMOS transistors. In normal operation, the voltage dropping components are placed in series with the charge pump, thereby returning the voltage applied to the flash macro to the normal level ($V_{NE}$).

Also in accordance with the objects of the invention, a flash EPROM memory device having an internally generated margin erase voltage is achieved. The margin erase circuitry of the flash EPROM memory device comprises a high voltage switch with the cathode of a diode operated at reverse bias connected to it. The anode of the diode is connected to a plurality of series connected voltage dropping devices selected from a group consisting of diode connected NMOS transistors, PMOS transistors, native NMOS transistors and diodes. A bias current source is connected to the opposite end of the plurality of series connected voltage dropping devices. During margin erasing, the voltage applied at the charge pump is reduced over normal erasing by bypassing one or more of the voltage dropping devices.

BRIEF DESCRIPTION OF THE DRAWINGS

In the accompanying drawings forming a material part of this description, there is shown.

DESCRIPTION OF THE PREFERRED EMBODIMENTS

The present invention uses the existing charge pump circuitry to generate the voltage for both normal and margin erasing. This eliminates the need for an external voltage pad to perform margin erasing and develops a margin erase voltage that better tracks over manufacturing variations.

Figure 1:
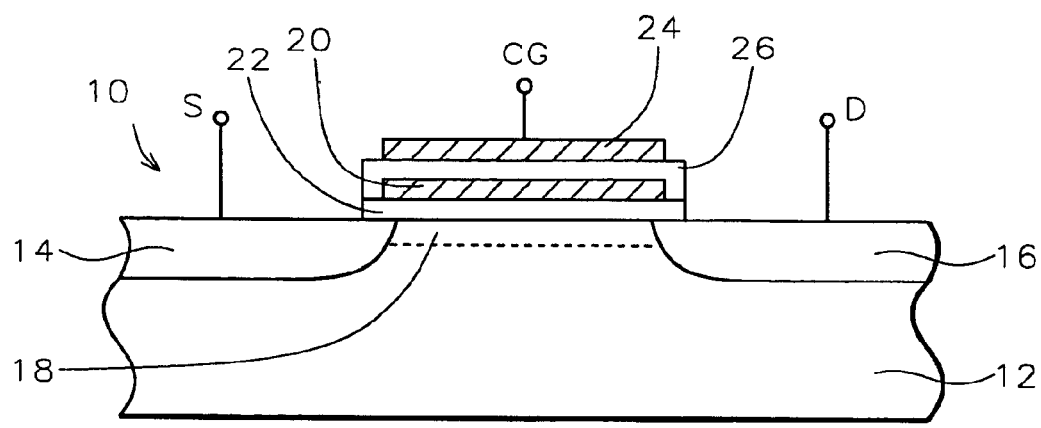
FIG. 1 schematically illustrating in cross-sectional representation a typical Flash EPROM memory cell, FIG. 2 illustrating the variation of minimum erase voltage with the number of erasure cycles in a typical Flash EPROM memory, FIG. 3 illustrating a schematic diagram representation of the method of marginal and normal erasure used in a typical Flash EPROM memory, FIG. 4 illustrating the variation of normal erase voltage ($V_{NE}$) due to process variation and the variation in difference between the marginal erase voltage ($V_{ME}$) and $V_{NE}$ in a typical Flash EPROM memory, FIG. 5 schematically illustrating the application of the present invention to a Flash EPROM memory, and FIG. 6 illustrating the variation of the normal erase voltage ($V_{NE}$) and marginal erase voltage ($V_{ME}$) due to process variation and that the difference between $V_{ME}$ and $V_{NE}$ is fixed using the circuit of the present invention in a Flash EPROM memory.
Figure 2:
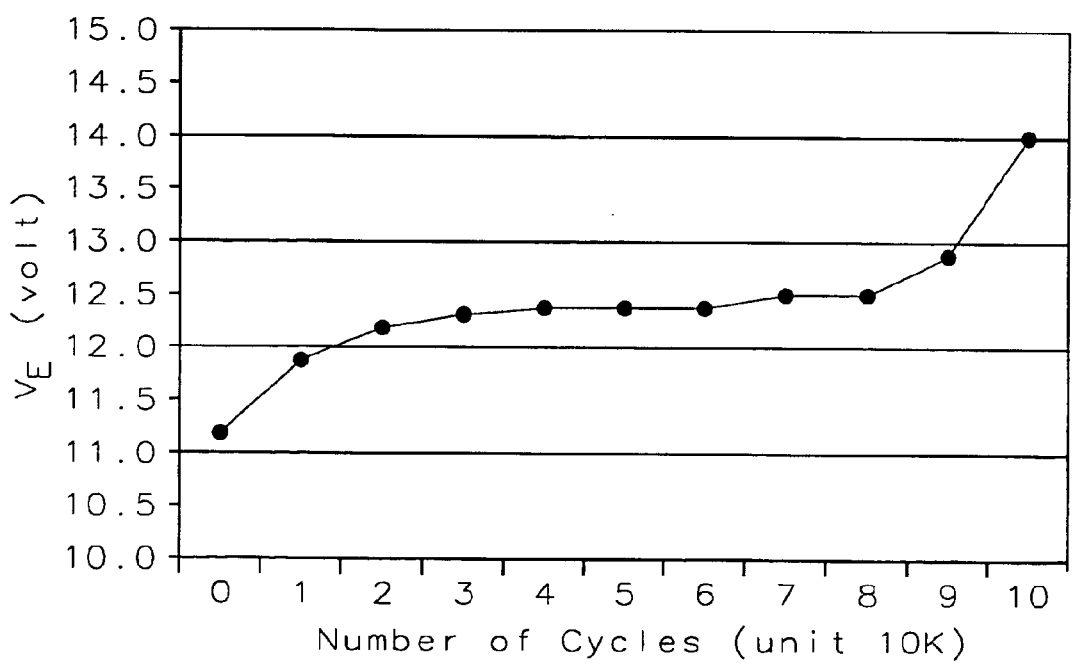
Figure 3:
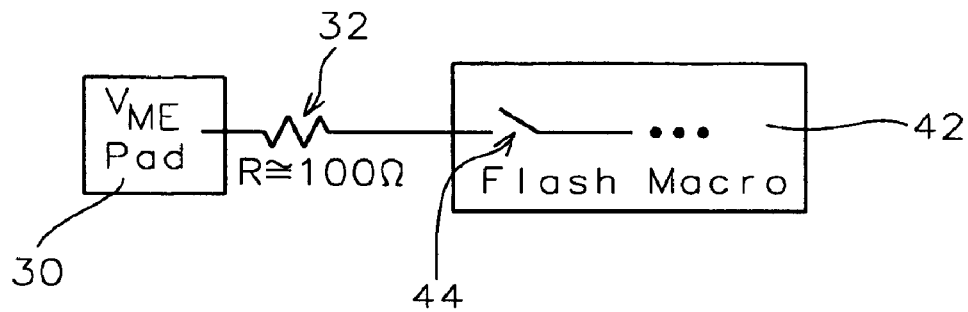
Figure 4:
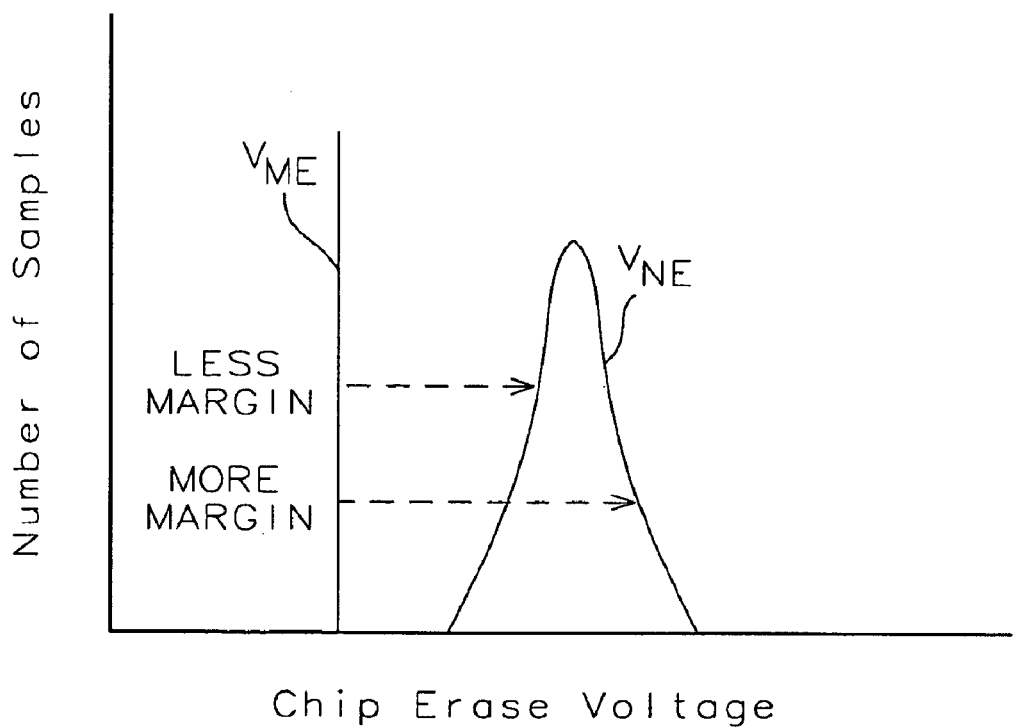
Figure 5:
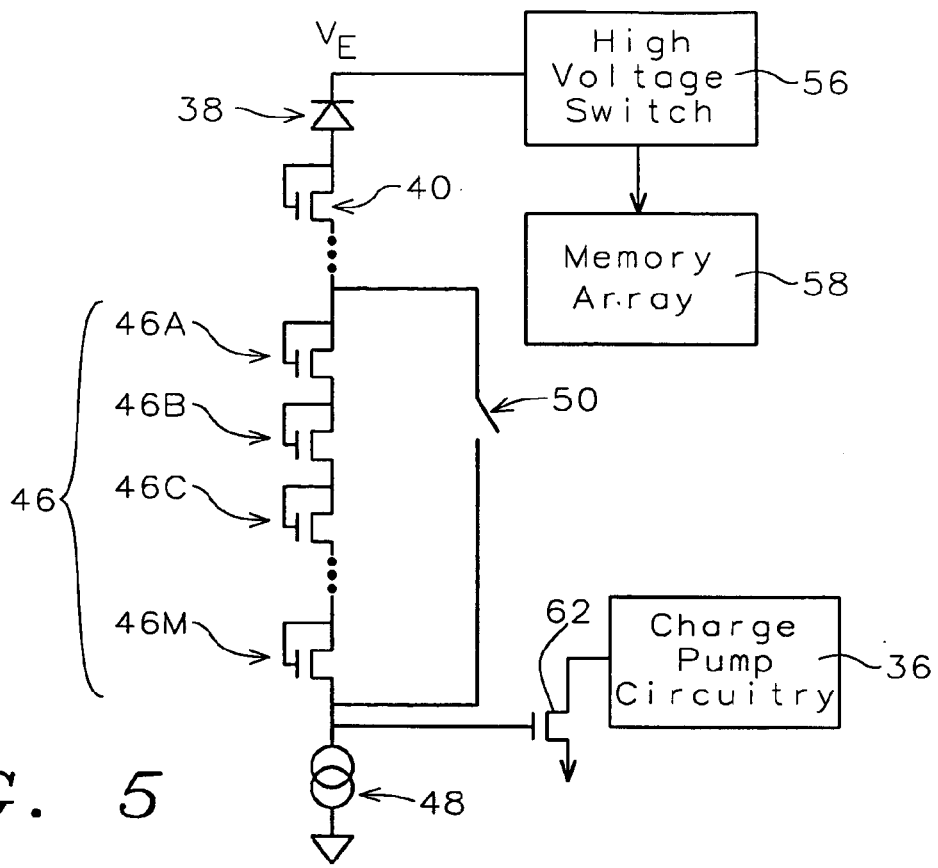

Refer now to FIG. 5, schematically depicting the method of the present invention. In this high voltage regulator, the cathode of a diode 38, operating at reverse baize, is connected to a high voltage switch 56. The anode of the diode is connected to one (or more) diode-connected NMOS transistor(s) 40, for example. A diode-connected NMOS transistor is one where the drain and gate are connected. When conducting, the voltage drop across each diode-connected NMOS transistor will be equal to the transistor threshold voltage (V).

Referring still to FIG. 5, the important details of the present invention are illustrated. A plurality (m) of diode connected NMOS transistors 46 are connected in series (i.e. the drain of transistor 40b is connected to the source of transistor 40a, the drain of transistor 46c is connected to the source of transistor 46b, etc.). The source of the diode-connected NMOS transistor(s) 40 is connected to the drain of transistor 46a. The source of the $m^{th}$ transistor 46m is connected to the bias current source 48. The drain of the transistor 62 is connected to the charge pump. The current of transistor 62 will control the pumping frequency of the charge pump. n is the total number of diodes 40 connected in the regulator. The diode chain 40 and 46 combined with diode 38 is a high voltage detector circuit. The high voltage detector circuit detects the level of charge pump output. The output of the voltage detector is used to control the pumping frequency of the charge pump.

A bypass switch 50 is connected across the series connected NMOS transistors 46 such that when closed, it connects the source of transistor 40 directly to the bias current source 48. Alternately, diode-connected PMOS transistors or native NMOS transistor diodes may be used in place of the diode-connected NMOS transistors.

The function f the margin erase circuit of the present invention is now described. During normal operation, the bypass switch 50 is opened. The voltage, $V_E$, generated by the charge pump 36 and regulated by this regulator will be the normal erase voltage ($V_{NE}$), which is the sum of the voltage drops across the n transistors 46a–46m and 40 and the breakdown voltage ($V_{bd}$) of the diode 38. Since the voltage drop across each of the transistors 46a–46m and transistors 40 (a total of n transistors) is equal to Vt and V, respectively (threshold voltage of NMOS transistor), the normal erase voltage observed at the cathode of the protective diode 38 is given by:

$$V_{NE}=V_{bd}+n*V+m*Vt+V_t m1$$

Where $V_t$_m1 is the threshold voltage of transistor 62. The voltage $V_E=V_{NE}$ is applied to the flash memory 58 through the high voltage switch 56.

During testing, the bypass switch 50 is closed thereby bypassing transistors 46a–46m. This reduces the voltage observed at the cathode of the diode 38 by $m*V_t$. Thus, the margin erase voltage is given by:

$$V_{ME}=V_{bd}+n*V+V_{t\_}m1$$

During testing, the erase voltage VE applied to the flash memory 58 through the high voltage switch 56 will be VME. After performing a margin erase, the erase is verified by reading the data stored in the memory array. If the data has been erased, the marginal erase test is verified as successful.

Figure 6:
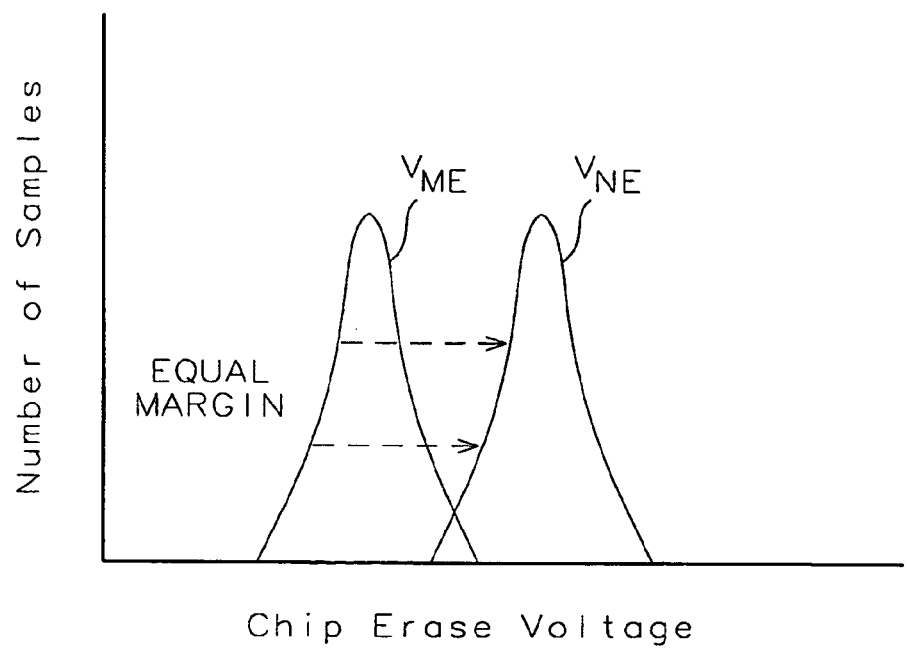

Refer now to FIG. 6 illustrating the variation in $V_{NE}$ due to process tolerance. Since the characteristics of the plurality of transistors 46a–46m will follow the same process variations, the difference between $V_{ME}$ and $V_{NE}$ will be approximately fixed. This allows for better prediction of the operation of the device over multiple cycles using the marginal erase method.

The present invention uses a method where a plurality of diode-connected NMOS transistors are added in series with the connection to the point of application of the erase voltage ($V_E$). During testing, some transistors are bypassed, thereby effectively reducing voltage ($V_E$). During testing, some transistors are bypassed, thereby effectively reducing the applied erase voltage to the marginal level desired ($V_{ME}$). The voltage applied to the flash cells is reduced by $m*V_t$, where m is the number of diode-connected NMOS transistors bypassed and $V_t$ is the threshold voltage of the NMOS transistors. In normal operation, the plurality of diode connected NMOS transistors are not bypassed, thereby returning the voltage applied to the flash macro to the normal level ($V_{NE}$). One advantage of this method over prior art methods is that the present invention allows the marginal erase voltage to track the normal erase voltage through process variations. This facilitates better prediction of device eraseability over the device life. A second advantage is the elimination of the test pad required to apply the marginal erase voltage in prior art margin erase test methods.

While the invention has been particularly shown and described with reference to the preferred embodiments thereof, it will be understood by those skilled in the art that various changes in form and details may be made without departing from the spirit and scope of the invention.

What is claimed is:

1. A method of margin erasing memory cells in the testing procedure of a flash EPROM memory in an integrated circuit wherein said margin erasing uses the same charge pump circuitry to develop both the normal erase voltage used in normal operation and the margin erase voltage used in said testing procedure
   wherein a NMOS transistor affects an output of said charge pump circuitry, with its gate directly controlled by a voltage level generated only from said output of said charge pump circuitry,
   wherein said voltage level at said gate of said NMOS transistor is adjusted during said margin erasing so that said margin erase voltage applied to said memory cells during said margin erasing is reduced over said normal erase voltage.

2. The method according to claim 1 wherein said margin erase voltage applied to said memory cells during said margin erasing is reduced over said normal erase voltage by bypassing serially connected voltage dropping components.

3. The method according to claim 2 wherein said serially connected voltage dropping components are selected from the group consisting of: diode connected NMOS transistors, PMOS transistors, native NMOS transistors and diodes.

4. The method according to claim 2 wherein said serially connected voltage dropping components are not bypassed during development of said normal erase voltage.

5. The method according to claim 1 wherein said margin erase voltage applied to said memory cells during said margin erasing is reduced over said normal erase voltage by bypassing a plurality of diode-connected NMOS transistors.

6. The method according to claim 5 wherein said plurality of diode-connected NMOS transistors is not bypassed during development of said normal erase voltage.

7. The method according to claim 1 wherein said margin erase voltage applied to said memory cells during said margin erasing is reduced over said normal erase voltage by bypassing a plurality of diode-connected PMOS transistors.

8. The method according to claim 7 wherein said plurality of diode-connected PMOS transistors is not bypassed during development of said normal erase voltage.

9. The method according to claim 1 wherein said margin erase voltage applied to said memory cells during said margin erasing is reduced over said normal erase voltage by bypassing a plurality of native NMOS transistors.

10. The method according to claim 9 wherein said plurality of native NMOS transistors is not bypassed during development of said normal erase voltage.

11. The method according to claim 1 wherein said margin erase voltage applied to said memory cells during said margin erasing is reduced over said normal erase voltage by bypassing a plurality of diodes.

12. The method according to claim 11 wherein said plurality of diodes is not bypassed during development of said normal erase voltage.

13. A method of margin erasing memory cells in the testing procedure of a flash EPROM memory in an integrated circuit wherein said margin erasing uses the same internal charge pump circuit to develop both the normal erase voltage used in normal operation and the margin erase voltage used in said testing procedure;
   wherein a NMOS transistor affects an output of said charge pump circuit, with its gate directly controlled by a voltage level generated only from said output of said charge pump circuit,
   and wherein said voltage level at said gate of said NMOS transistor is adjusted during said margin erasing so that said margin erase voltage applied to said memory cells during said margin erasing is reduced over said normal erase voltage by bypassing serially connected voltage dropping components wherein said voltage is reduced by m times a threshold voltage of one of said voltage dropping components where m is the number of voltage dropping components connected in the same.

14. The method according to claim 13 wherein margin erase voltage is reduced by bypassing said serially connected voltage dropping components.

15. The method according to claim 14 wherein said serially connected voltage dropping components are selected from the group consisting of: diode connected NMOS transistors, PMOS transistors, native NMOS transistors and diodes.

16. The method according to claim 14 wherein said serially connected voltage dropping components are not bypassed during development of said normal erase voltage.

17. The method according to claim 13 wherein said margin erase voltage applied to said memory cells during said margin erasing is reduced over said normal erase voltage by bypassing a plurality of diode-connected NMOS transistors.

18. The method according to claim 17 wherein said plurality of diode-connected NMOS transistors is not bypassed during development of said normal erase voltage.

19. The method according to claim 13 wherein said margin erase voltage applied to said memory cells during said margin erasing is reduced over said normal erase voltage by bypassing a plurality of diode-connected PMOS transistors.

20. The method according to claim 19 wherein said plurality of diode-connected PMOS transistors is not bypassed during development of said normal erase voltage.

21. The method according to claim 13 wherein said margin erase voltage applied to said memory cells during said margin erasing is reduced said normal erase voltage by bypassing a plurality of native NMOS transistors.

22. The method according to claim 21 wherein said plurality of native NMOS transistors is not bypassed during development of said normal erase voltage.

23. The method according to claim 13 wherein margin erase voltage applied to said memory cells during said margin erasing is reduced over said normal erase voltage by bypassing a plurality of diodes.

24. The method according to claim 23 wherein said plurality of diodes is not bypassed during development of said normal erase voltage.

25. A flash EPROM memory device comprising:
- a charge pump circuit;
- a diode having a cathode and an anode wherein said cathode of said diode is connected to said flash EPROM memory device through a high voltage switch;
- a plurality of series connected voltage dropping devices wherein a drain of a first of said plurality of series connected voltage dropping devices is connected to said anode of said diode wherein said charge pump circuit is connected in series with said plurality of series connected voltage dropping devices;
- a NMOS transistor affects an output of said charge pump circuitry, with its gate coupled to said output of said charge pump circuit through said voltage dropping devices, wherein said voltage level at said gate of said NMOS transistor is adjusted during said margin erasing;
- a bias current source connected to a source of said plurality of series connected voltage dropping devices; and
- a bypass switch to bypass one or more of said series connected voltage dropping devices wherein during normal operation of said flash EPROM memory device, said plurality of series connected voltage dropping devices is not bypassed wherein said charge pump circuit provides a normal erase voltage and wherein during margin erasing, said plurality of series connected voltage dropping devices is bypassed wherein said charge pump circuit provides a margin erase voltage that is lower than said normal erase voltage.

26. The method according to claim 25 wherein said series connected voltage dropping devices are selected from the group consisting of: diode connected NMOS transistors, PMOS transistors, native NMOS transistors and diodes.

* * * * *